United States Patent
Absar et al.

(10) Patent No.: US 6,839,674 B1
(45) Date of Patent: Jan. 4, 2005

(54) METHOD AND APPARATUS FOR SPECTRAL EXPONENT RESHAPING IN A TRANSFORM CODER FOR HIGH QUALITY AUDIO

(75) Inventors: Mohammed Javed Absar, Singapore (SG); Sapna George, Singapore (SG); Antonio Mario Alvarez-Tinoco, Singapore (SG)

(73) Assignee: STMicroelectronics Asia Pacific Pte Limited, Singapore (SG)

( * ) Notice: Subject to any disclaimer, the term of this patent is extended or adjusted under 35 U.S.C. 154(b) by 0 days.

(21) Appl. No.: 09/582,766
(22) PCT Filed: Jan. 12, 1998
(86) PCT No.: PCT/SG98/00002
§ 371 (c)(1), (2), (4) Date: Sep. 29, 2000
(87) PCT Pub. No.: WO99/35758
PCT Pub. Date: Jul. 15, 1999

(51) Int. Cl.[7] .............................................. G10L 19/00
(52) U.S. Cl. ...................................... 704/500; 704/201
(58) Field of Search ................................. 704/500–504, 704/201

(56) References Cited

U.S. PATENT DOCUMENTS

| | | | | | |
|---|---|---|---|---|---|
| 4,829,522 A | * | 5/1989 | Nishiguchi | ................... | 714/747 |
| 5,041,830 A | * | 8/1991 | Abe | ............................. | 341/77 |
| 5,581,653 A | * | 12/1996 | Todd | .......................... | 704/229 |
| 5,623,577 A | * | 4/1997 | Fielder | ..................... | 704/200.1 |
| 5,825,807 A | * | 10/1998 | Kumar | ........................ | 375/130 |

* cited by examiner

Primary Examiner—Vijay Chawan
Assistant Examiner—Michael N. Opsasnick
(74) Attorney, Agent, or Firm—Lisa K. Jorgenson; Robert Iannucci; Seed IP Law Group PLLC

(57) ABSTRACT

A method and apparatus for coding audio data in a frequency transform digital audio coder employing differential frequency coefficient exponent coding. Differential coding of exponents places constraints on possible values an exponent can take, which can lead to distortion in the decoded and reconstructed audio signal. The method and apparatus herein can overcome this restriction by mapping the input exponent set to a new set of values which satisfy the differential constraint as well as reducing information loss, thereby minimizing overall signal distortion due to coding restrictions.

15 Claims, 6 Drawing Sheets

METHOD AND APPARATUS FOR SPECTRAL EXPONENT RESHAPING IN A TRANSFORM CODER FOR HIGH QUALITY AUDIO

TECHNICAL FIELD

This invention is applicable in the field of audio coders, which employ differential coding of the exponents obtained by normalisation of the frequency domain coefficients.

BACKGROUND ART

In order to more efficiently broadcast or record audio signals, the amount of information required to represent the audio signals may be reduced. In the case of digital audio signals, the amount of digital information needed to accurately reproduce the original pulse code modulation (PCM) samples may be reduced by applying a digital compression algorithm, resulting in a digitally compressed representation of the original signal. The goal of the digital compression algorithm is to produce a digital representation of an audio signal which, when decoded and reproduced, sounds the same as the original signal, while using a minimum of digital information for the compressed or encoded representation.

Recent advances in audio coding technology have led to high compression ratios while keeping audible degradation in the compressed signal to a minimum. These coders are intended for a variety of applications, including 5.1 channel film soundtracks, HDTV, laser discs and multimedia. Description of one applicable method can be found in the Advanced Television Systems Committee (ATSC) Standard document entitled "Digital Audio Compression (AC-3) Standard", Document A/52, 20 Dec. 1995.

In the basic approach, at the encoder the time domain audio signal is first converted to the frequency domain using a bank of filters. The frequency domain coefficients, thus generated, are converted to fixed point representation. In fixed point syntax, each coefficient is represented as a mantissa and an exponent. The bulk of the compressed bitstream transmitted to the decoder comprises these exponents and mantissas.

The exponents are usually transmitted in their original form. However, each mantissa must be truncated to a fixed or variable number of decimal places. The number of bits to be used for coding each mantissa is obtained from a bit allocation algorithm which may be based on the masking property of the human auditory system. Lower numbers of bits result in higher compression ratios because less space is required to transmit the coefficients. However, this may cause high quantization errors, leading to audible distortion. A good distribution of available bits to each mantissa forms the core of the advanced audio coders.

Further compression is possible by employing differential coding for the exponents. In this case the exponents for a channel are differentially coded across the frequency range. The first exponent is sent as an absolute value. Subsequent exponent information is sent in differential form, subject to a maximum limit. That is, consecutive exponents are allowed to differ only within a given upper limit. This restriction is called the differential-constrain, the impact of which is addressed herein.

The differential coding of exponents with a limit on maximum allowable difference between any two consecutive exponents may result in signal distortion. The differential-constraint may force some exponents to be coded to a value larger than the original, while others may be restricted to smaller value than the original.

SUMMARY OF THE INVENTION

In accordance with the present invention, there is provided a method for coding a sequence of frequency coefficients comprising respective exponents and mantissas in a digital audio coder, comprising:

a) selecting a base frequency coefficient in said sequence;

b) differentially coding said frequency coefficients with a preselected differential constraint limit from said base coefficient in a forward sequence direction until a first predetermined condition with respect to exponent values of adjacent frequency coefficients in said sequence is detected;

c) identifying a local peak in exponent values of coefficients in said forward sequence direction, and selecting the peak coefficient as a new base frequency coefficient;

d) differentially coding said frequency coefficients with said differential constraint limit from said base coefficient in a reverse sequence direction until a second predetermined condition with respect to exponent values of adjacent frequency coefficients in said sequence is detected; and e) repeating from step b) until the entire sequence of frequency coefficients has been coded.

The first predetermined condition preferably corresponds to an information loss as a result of said differential constraint limit.

In the preferred embodiment of the method, differentially coding said frequency coefficients includes shifting the coded mantissa of a coefficient to prevent information loss in the coded coefficient as a result of application of the differential constraint limit to the corresponding coded efficient exponent.

The present invention also provides a method for coding a sequence of data elements each comprising an exponent and corresponding mantissa, including the steps of:

a) coding a first data element in the sequence as a base value;

b) coding a successive data element in the sequence with a coded exponent constrained by a differential limit with respect to the preceding data element exponent;

c) determining a difference between the coded exponent of the successive data element and the original exponent thereof as a result of said differential limit;

d) if the difference at step c) is of a first sign, shifting the coded mantissa of the successive data element according to the magnitude of the difference;

e) if the difference determined at step c) is of a second sign:
  i) examining data elements in the sequence to identify a data element exponent at a successive local peak in exponent values;
  ii) coding data elements in the reverse sequence order from said local peak data element, with coded exponents constrained by said differential limit and corresponding mantissas shifted according to a difference between the respective coded and original exponent values; and f) repeating steps b) to e) for the data elements in the sequence.

Preferably the sequence of data elements comprise data representing digital audio data frequency coefficients.

Preferably the reverse coding of step e)ii) is carried out until the differences in value between adjacent coded exponents of each of the data elements from the local peak to the first data element are within said differential limit.

In the preferred implementation of the method, following the execution of step e) the successive data element coded at step b) is the data element sequentially following said local peak data element.

The present invention further provides a digital audio coder for generating coded frequency coefficients from digital audio data, comprising:

a frequency domain transform processor coupled to receive input audio data and generate a sequence of frequency coefficients therefrom, each frequency coefficient comprising an exponent and a mantissa;

a differential coding processor coupled to receive said sequence of frequency coefficients from the frequency domain transform processor, and adapted to select a base frequency coefficient from said sequence and iteratively:

differentially code said frequency coefficients with a preselected differential constraint limit from said base coefficient in a forward sequence direction until a first predetermined condition with respect to exponent values of adjacent frequency coefficients in said sequence is detected;

identify a local peak in exponent values of coefficients in said forward sequence direction, and select the peak coefficient as a new base frequency coefficient; and differentially code said frequency coefficients with said differential constraint limit from said base coefficient in a reverse sequence direction until a second predetermined condition with respect to exponent values of adjacent frequency coefficients in said sequence is detected;

until the entire sequence of frequency coefficients has been coded.

Preferably the differential coding processor shifts the coded mantissa of a coefficient to prevent information loss in the coded coefficient as a result of application of the differential constraint limit to the corresponding coded coefficient exponent.

The basis of the embodiments of the present invention derive from a theorem, described in detail hereinbelow, according to which an exponent differential coded with a constraint limit to a value larger than the original does not result in any information loss. However, an exponent restricted to a smaller value would always result in information loss. Therefore, and audio data coder can prevent this information loss by mapping the original exponents to a new a set of values such that they satisfy the differential-constraint.

Suppose the original exponents are $(e_0, e_1, e_2, \ldots, e_{n-1})$. A reshaping algorithm could map these exponents to a new set $(e'_0, e'_1, e'_2, \ldots, e'_{n-1})$ such that:

$$\|e'_{i+1} - e'_i\| < L, \ i=0 \ldots n-1 \quad 1.$$

where L is the maximum allowed difference between two consecutive exponents (satisfying this condition is essentially equivalent to satisfying the differential-constraint); and $$e'_i \geq e_i, \ i=0 \ldots n-1 \quad 2.$$

which is the condition to be satisfied for no information loss to occur.

BRIEF DESCRIPTION OF THE DRAWINGS

The invention is described in greater detail hereinbelow, by way of example only, through description of an embodiment thereof and with reference to the accompanying drawings, wherein.

DETAILED DESCRIPTION OF THE PREFERRED EMBODIMENTS

Figure 1:
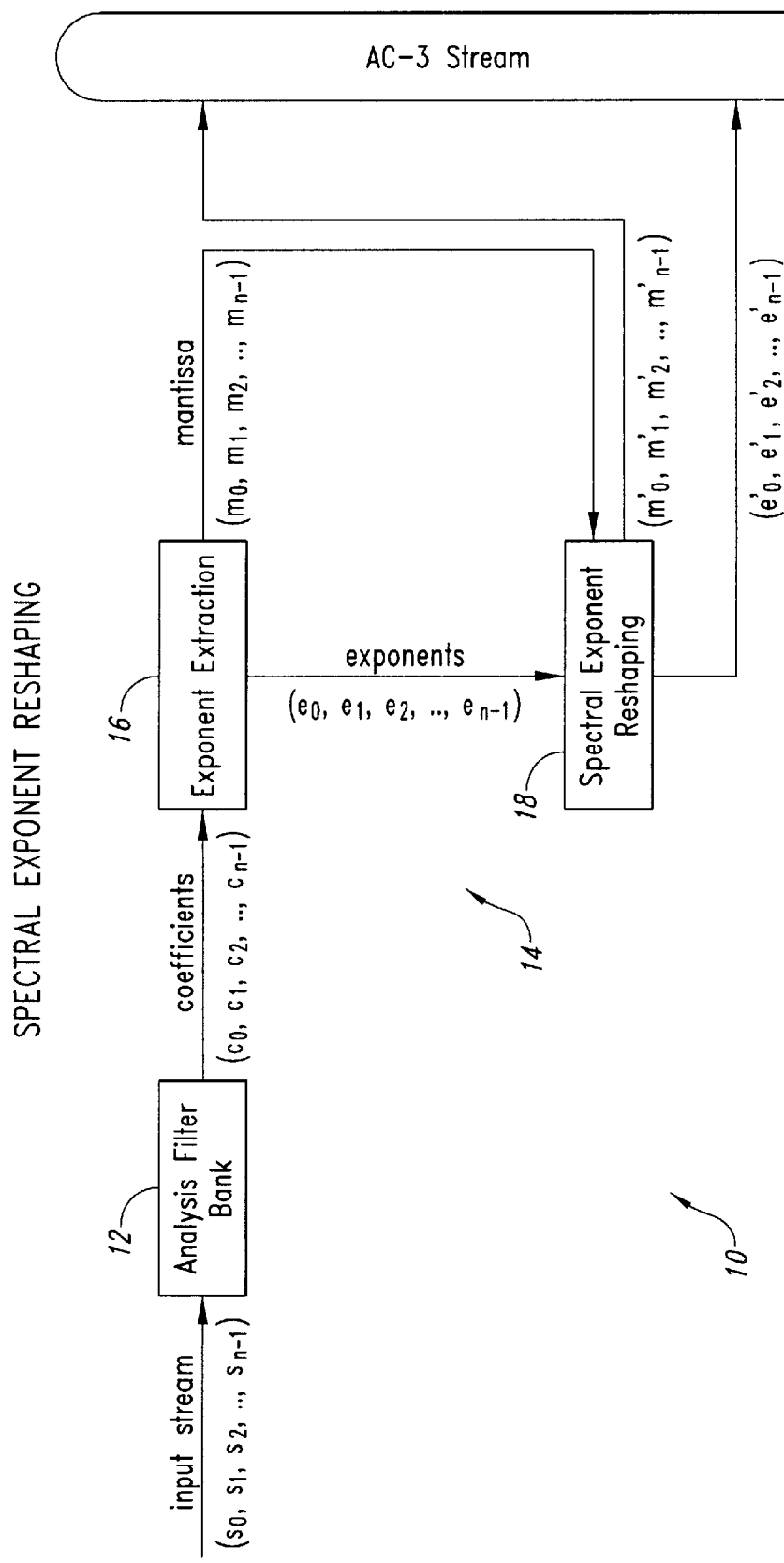
FIG. 1 is a diagrammatic block diagram of a digital audio coder spectral exponent reshaping system according to an embodiment of the present invention.

The input to an audio coder comprises a stream of digitised samples of the time domain analog audio signal. The input stream is sectioned into blocks, each block containing n consecutive samples. Thus, within a block the n samples form an ordered set $(s_0, s_1, s_2, \ldots, s_{n-1})$. The time domain samples $(s_0, s_1, s_2, \ldots, s_{n-1})$ are converted to the frequency domain using an analysis filter bank (see FIG. 1) The frequency domain coefficients, thus generated, form another ordered set which can be identified as $(c_0, c_1, c_2, \ldots, c_{n-1})$. Here $c_0$ is the lowest frequency (DC) component while $c_{n-1}$ is the highest frequency component of the signal.

In essence, audio compression entails finding how much of the information in the set $(c_0, c_1, c_2, \ldots, c_{n-1})$ is necessary to reproduce the original analog signal at the decoder with minimal audible distortion.

The coefficient set $(c_0, c_1, c_2, \ldots, c_{n-1})$ is next converted into floating point format, where each coefficient $c_i$ is represented by an exponent e and mantissa m. By definition, $e = \text{floor}(\log_2(c_i))$. Since coefficients are always less than unity, the exponent is always non-positive. Also, mantissa $m_i = (c_i)/e_i$. The exponents and mantissas form two ordered sets $(e_0, e_1, e_2, \ldots, e_{n-1})$ and $(m_0, m_1, m_2, \ldots, m_{n-1})$. Each coefficient $c_i$ is related to the exponent $e_i$ and mantissa $m_i$ by the relation $c_i = m_i * 2^{e_i}$.

For example, if the coefficient $c_i=0.000001011$ (in binary), then $e_i=\text{floor}(\log_2(c_i))=-5$ and $m_i=(c_i)/e_i=0.1011$. Note that, $m_i * 2^{e_i} = 0.000001011$, which is indeed same as $c_i$. This is in fact the way coefficients can be reconstructed at the decoder.

The exponent set is usually transmitted in its original form. However, the mantissa is truncated to a fixed or variable number of decimal places. Suppose each mantissa $m_i$ is transmitted as $b_i$ number of bits. The value of $b_i$ is usually obtained from a bit allocation algorithm which for advanced psychoacoustic coders may be based on the masking property of the human auditory system. Low values of $b_i$ result in higher compression ratios because less space is required to transmit the coefficients. However this causes very high quantization error, leading to audible distortion. A good distribution of available bits to each mantissa forms the core of the most advanced encoders.

Further compression is possible by employing differential coding for the exponent set. In this case the exponents for a channel are differentially coded across frequency range. The first component $c_0$ is sent as an absolute value. Subsequent coefficient information is sent in differential form, subject to a differential limit, L. For example, with a differential limit of L=2, each differential exponent would be allocated one of the five values: −2, −1, 0, +1, +2. Thus, for each differentially expressed exponent, instead of sending the value of $e_i$ the value $(e_i-e_{i-1})$ is sent, subject to a maximum of +/− L. That is a difference of up to +/− L is only allowed between two consecutive exponents. This restriction is called the differential constraint, the impact of which is discussed below.

Suppose the exponent set $(e_0, e_1, e_2, \ldots, e_{n-1})$ generated for a particular case is as follows:

| $e_0$ | $e_1$ | $e_2$ | $e_3$ | $e_4$ | $e_5$ | $e_6$ | $e_7$ | $e_8$ | $e_9$ | $e_{10}$ | $e_{11}$ | $e_{12}$ | $e_{13}$ | $e_{14}$ | $e_{15}$ | $e_{16}$ |
|---|---|---|---|---|---|---|---|---|---|---|---|---|---|---|---|---|
| −13 | −16 | −12 | −13 | −12 | −9 | 0 | −10 | −18 | −20 | −19 | −5 | −19 | −21 | −22 | −20 | −22 |

Figure 2:
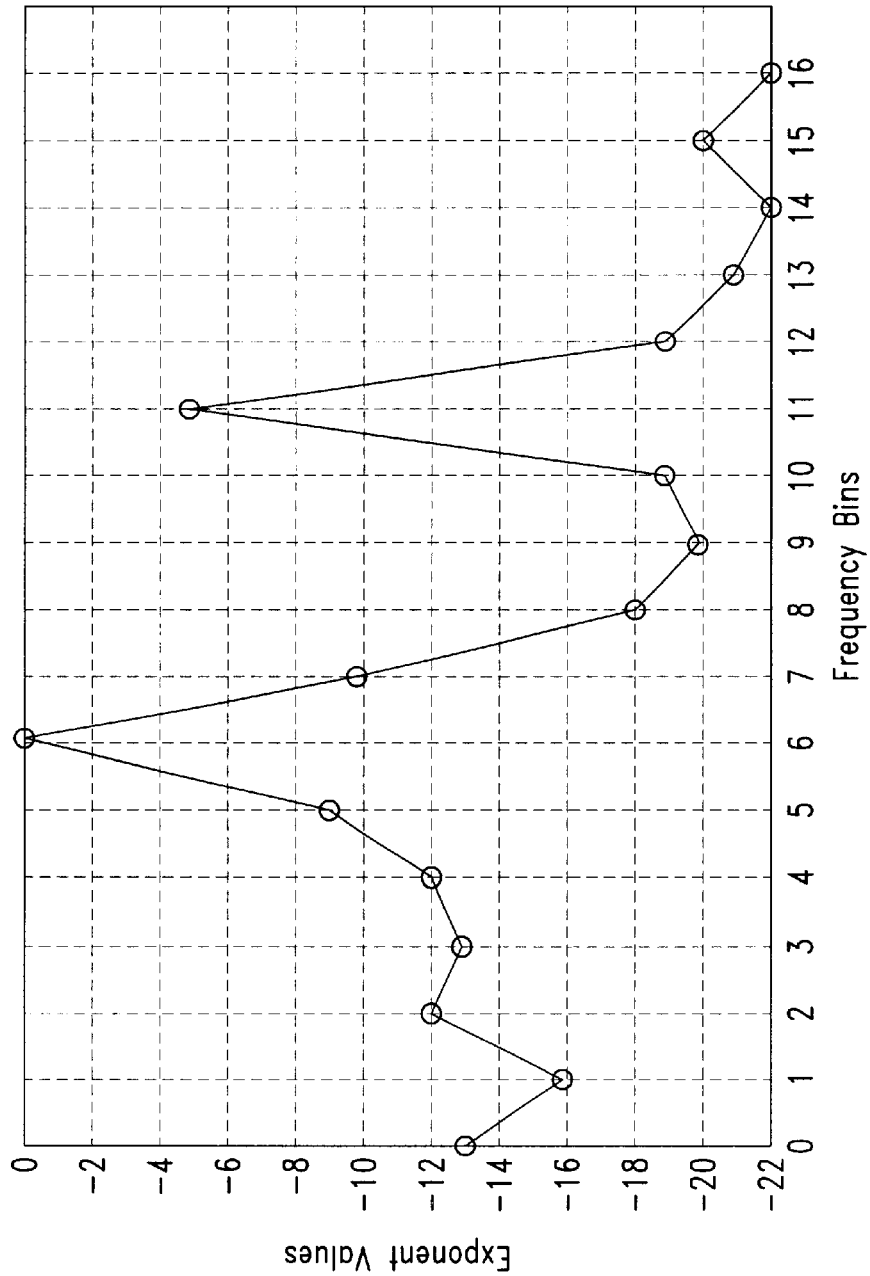
FIG. 2 is a graph of exponent values over a frequency range illustrating an example of an original spectrum.

This exponent set is represented graphically in FIG. 2

The conventional differential exponent coding technique with a differential limit of L=2 would proceed as follows:

i) $c_0$ is coded as −13, since the first exponent $_0e$ is always sent as an absolute value.

ii) The next exponent, $e_1$, in the original spectrum is equal to −16. However, due to the differential constraint that a maximum difference of only +/−2 is allowed between two consecutive exponents, $e_1$ can be at best encoded as −15. By best, it is meant that the minimum possible difference between the original and encoded exponent, while still satisfying the differential-constraint.

iii) The next exponent, $e_2$, is −12 in the original spectrum, but again due to the differential-constraint this can at best be encoded as −13.

Proceeding in this manner the new differentially encoded exponent set which is sent to decoder would be:

| $e'_0$ | $e'_1$ | $e'_2$ | $e'_3$ | $e'_4$ | $e'_5$ | $e'_6$ | $e'_7$ | $e'_8$ | $e'_9$ | $e'_{10}$ | $e'_{11}$ | $e'_{12}$ | $e'_{13}$ | $e'_{14}$ | $e'_{15}$ | $e'_{16}$ |
|---|---|---|---|---|---|---|---|---|---|---|---|---|---|---|---|---|
| −13 | −15 | −13 | −13 | −12 | −10 | −8 | −10 | −12 | −14 | −16 | −14 | −16 | −18 | −20 | −20 | −22 |

Figure 3:
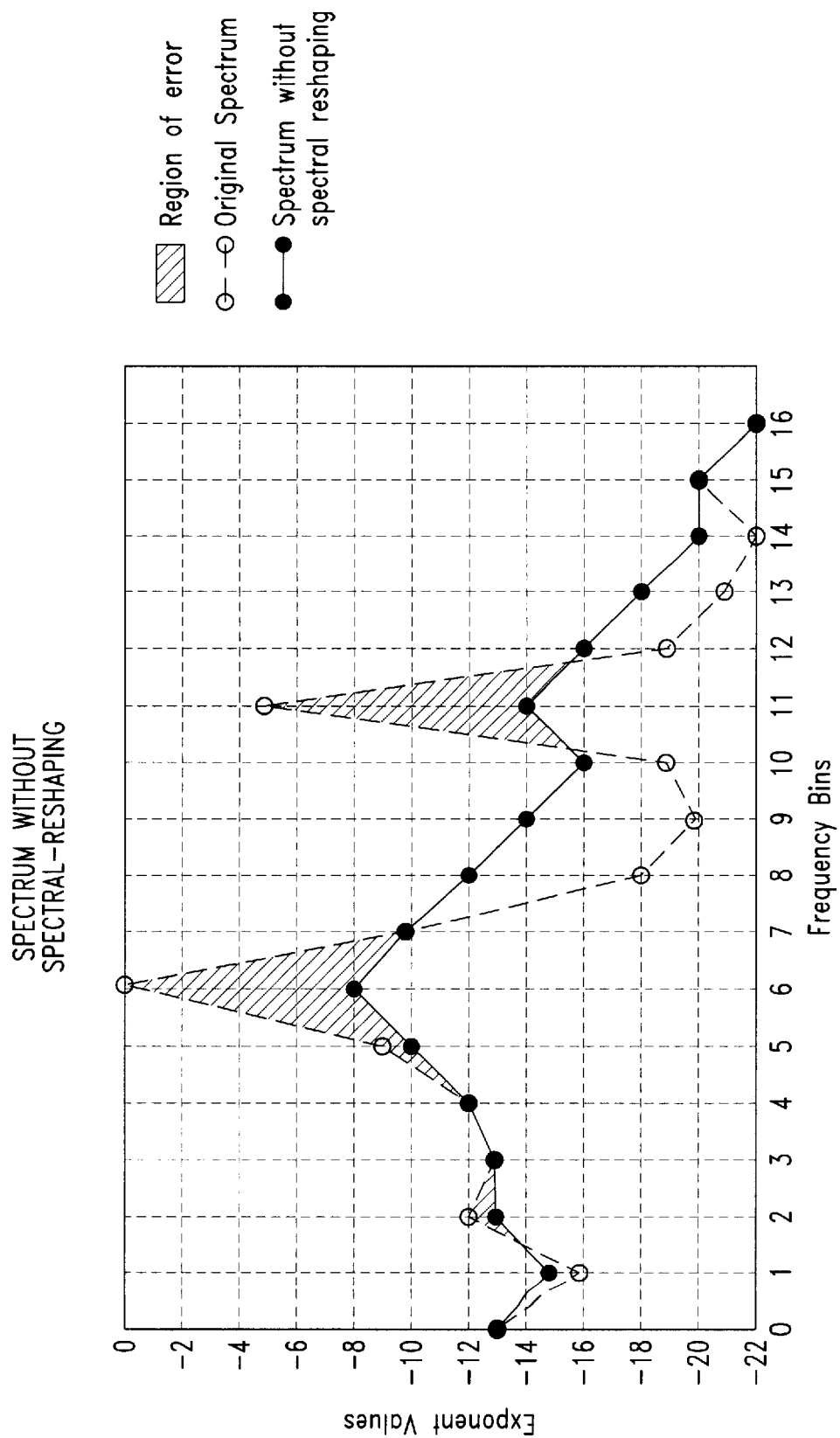
FIG. 3 is a graph of exponent values over a frequency range illustrating a deviation of the original spectrum due to a differential constraint.

FIG. 3 shows the deviation of differentially encoded spectral envelope from the original spectrum due to the differential-constraint. The shaded region corresponds to the error due to differential coding, as explained in the analysis below.

Suppose $e_i=-5$ and $m_i$ consists of bits $m_{i0}\,m_{i1}\,m_{i2}\,m_{i3}\ldots$. Due to the differential-constraint, assume that $e_i$ is sent as −3 instead of −5.

Now, $$c_i=(0.m_{i0}\,m_{i1}\,m_{i2}\,m_{i3}\ldots)*2^{-5}=(0.m_{i0}\,m_{i1}\,m_{i2}\,m_{i3}\ldots*2^{-2})*2^{-3}=(0.00m_{i0}\,m_{i1}\,m_{i2}\,m_{i3}\ldots)*2^{-3}$$

Therefore exponent can be sent as −3, as per the constraint. The mantissa is however adjusted to $00m_{i0}\,m_{i1}\,m_{i2}\,m_{i3}\ldots$ At the decoder the estimated coefficient is $(0.00m_{i0}\,m_{i1}\,m_{i2}\,m_{i3}\ldots)*2^{-3}=(0.m_{i0}\,m_{i1}\,m_{i2}\,m_{i3}\ldots)\times 2^{-5}$, which is identical to the original.

Now consider the opposite case, when the due to the differential coding constraint $e_i$ is to be sent as −6 instead of −5. Then, $$c_i=(0.m_{i0}\,m_{i1}\,m_{i2}\,m_{i3}\ldots)*2^{-5}=(0.m_{i0}\,m_{i1}\,m_{i2}\,m_{i3}\ldots *2^1)*2^{-6}=(m_{i0}\,m_{i1}\,m_{i2}\,m_{i3}\ldots)*2^{-6}$$

Therefore exponent can be sent as −6, as per the constraint. We want to send the mantissa as $m_{i0}\,m_{i1}\,m_{i2}\,m_{i3}\ldots$, (that is, the mantissa bits are sent as $m_{i0}\,m_{i1}\,m_{i2}\,m_{i3}\ldots$). However, at the decoder the mantissa is always treated as normalised $(0.m_{i0}\,m_{i1}\,m_{i2}\,m_{i3}\ldots)$.

It is evident, therefore, that whenever differential encoding contains the exponent to be larger than the actual one, the mantissa can be adjusted (right shifted) for the coefficient to retain the original value. However, if the exponent is made smaller by differential encoding then error is introduced which cannot be rectified by mantissa adjustment. This leads to the following theorem.

Theorem

Let $m_i$ and $e_i$ be the mantissa and exponent representing the coefficient $C_i=m_i\times 2^{ei}$. Also, $m_i$ is in normal form, that is $m_i=0.m_{i0}\,m_{i1}\,m_{i2}\,m_{i3}\ldots$, with $m_{i0}=1$.

If the mantissa bits transmitted as $m'_{i0}, m'_{i1}, m'_{i2}, m'_{i3}, \ldots$ are always interpreted by the receiver as $0.m'_{i0}, m'_{i1}, m'_{i2}, m'_{i3}\ldots$, then the coding of exponent $e_i$ as $e'_i$ where $e'_i \geq e_i$ can always be compensated by right shifting the mantissa by $\|e_i-e'_i\|$, which has same effect as prefixing the transmitted mantissa $m'_{i0}, m'_{i1}, m'_{i2}, m'_{i3}, \ldots$ with $\|e_i-e'\|$ zeros. Coding the exponent $e_i$ as $e'_i$ where $e'_i<e'_i$ will always result in loss of information.

On the basis of this theorem, it is then possible to devise an algorithm to overcome the limitations of differential encoding by spectral exponent reshaping.

Spectral Exponent Reshaping Algorithm

Let $(e_0, e_1, e_2, e_3, \ldots e_{n-1})$ be the ordered set of exponents. Spectral exponent reshaping is an inductive process and hence the algorithm described hereinbelow provides a solution by induction. Starting from $e_0$ and moving towards the right, exponents $e_1, \underline{e} \ldots$ are coded differentially. The base case for the induction is $e_0$ which can always be successfully coded initially as $e_o$ without loss of information.

Suppose $e_{i-1}$ has been recoded successfully as $e'_{i-1}$ without loss of information. Due to the differential-constraint, suppose $e_i$ can be represented closest as $e'_i$ (closest in the sense that $\|e_i-e'_i\|$ is minimum). If $e'_i \geq e$ then according to the above theorem, there is no information loss because the mantissa can be readjusted. Having coded $e_i$ as $e'_i$ the algorithm moves forward to code $e_{i+1}$. However, if $e'_i<e_i$ then information loss will occur and one more step of processing must be performed.

The algorithm starting from $e_i$, wherein information loss due to coding was first observed, moves right until the condition $e_i \leq e_{i+1} \leq e_{i+2} \leq e_{i+3} \ldots \leq e_{i+p}$ is satisfied. This indicates that $e_{i+p}$ is a local maximum in the spectral envelope. Exponent $e_{i+p}$ is coded as $e_{1+p}$ itself (like the initial exponent $e_0$). Then starting from $e_{i+p}$ the algorithm moves left differentially re-coding the exponents $e_{i+p-1}, e_{i+p-2}, e_{i+p-3}, \ldots$. It stops whenever $e_a$ (a<i) did not need to be re-coded to a new value. If $e_a$ did not need to be re-coded to enforce the differential-constraint then $e_{a-1}$, $e_{a-2}$, ... will automatically satisfy the differential-constraint due to the specific nature of the algorithm.

Having performed the spectral reshaping on the left of $e_{i+p}$, the algorithm continues the conventional exponent coding on the right of $e_{i+p}$ until it reaches another point where information loss due to differential-constraint occurs again. Because after every spectral reshaping to the left of $e_{i+p}$ the algorithm moves on to process the element $e_{i+p+1}$, and the number of elements in the set are finite, the algorithm is certain to terminate finally when the end of the ordered set is reached.

To determine the worst case time required to perform the spectral exponent reshaping algorithm, an order analysis can be used to show that even in the worst case the algorithm takes O(n) time. For example, let the initial exponent set be $(e_0, e_1, e_2, e_3, \ldots, e_{n-1})$. Assume that each comparison or recoding takes O(1) time. In a finite precision machine the number of bits are fixed, therefore the exponents are restricted to be more than a minima. Suppose the minima is γ.

Note that at any step of the algorithm an exponent is re-coded to a higher value and never to a smaller one. Therefore, the worst case for the algorithm is when the input exponent set is (γ,γ,γ, ... γ) and the final optimally reshaped exponent set is (0,0,0 ... , 0). Furthermore, at each step of the algorithm, since the worst case scenario is considered, an element is incremented by only one unit. Therefore there are, in the worst case, $K_1 \gamma n$ comparisons and $K_2 \gamma n$ re-codings ($K_1$ and $K_2$ are arbitrary constants). Therefore the algorithm, even in the worst case, gives O(n) performance. Moreover, any operation on all n numbers cannot be done in less than O(n) time, therefore no other algorithm can give a better order performance.

An example of an exponent set for an original spectrum is shown below, and illustrated graphically in FIGS. 2, 3 and 4.

value −13. The next exponent, $e_i = -16$. The maximum difference between two adjacent exponents, however, is +/−2. Therefore $e_1$ can be most closely represented by −15. However −15>−16, therefore by the theorem presented above does not necessitate a loss of information. Mantissa $m_1$ is shifted right by $\|-16-(-15)\|=1$ places. The coded components so far look as follows, the element in bold indicating the point to which processing has been performed.

| $e'_0$ | $e'_1$ | $e_2$ | $e_3$ | $e_4$ | $e_5$ | $e_6$ | $e_7$ | $e_8$ | $e_9$ | $e_{10}$ | $e_{11}$ | $e_{12}$ | $e_{13}$ | $e_{14}$ | $e_{15}$ | $e_{16}$ |
|---|---|---|---|---|---|---|---|---|---|---|---|---|---|---|---|---|
| −13 | −15 | −12 | −13 | −12 | −9 | 0 | −10 | −18 | −20 | −19 | −5 | −19 | −21 | −22 | −20 | −22 |

Now $e_2 = -12$, however due to the differential-constraint it can be at best represented as −13. The theorem dictates that this will result in loss of information, since −13<−12. Therefore using the above described method of the spectral reshaping, the processing point is shifted right until an exponent value representing a local maximum is reached.

In this example, $e_2$ is itself the local maximum, since $e_1 < e_2 > e_3$. Therefore starting from $e_2$, which is coded as −12 (no change) the spectral reshaping of $e'_1$, $e'_0$ is performed. Accordingly, $e'_1 = -15$ must be recoded as −14. Because the starting point of the spectral reshaping procedure is a local maximum, there will not be a case where it is necessary to decrement an exponent to the left to satisfy the differential-constraint. Note that −15<−14, therefore by the theorem this does not cause any information loss difficulties. The encoded exponent $e'_0 = -13$ still satisfies the differential constraint and therefore does not need re-coding. When an exponent is recoded by incrementing, the corresponding mantissa is shifted accordingly, as described above.

| $e_0$ | $e_1$ | $e_2$ | $e_3$ | $e_4$ | $e_5$ | $e_6$ | $e_7$ | $e_8$ | $e_9$ | $e_{10}$ | $e_{11}$ | $e_{12}$ | $e_{13}$ | $e_{14}$ | $e_{15}$ | $e_{16}$ |
|---|---|---|---|---|---|---|---|---|---|---|---|---|---|---|---|---|
| −13 | −16 | −12 | −13 | −12 | −9 | 0 | −10 | −18 | −20 | −19 | −5 | −19 | −21 | −22 | −20 | −22 |

The procedure performed according to the spectral exponent reshaping algorithm with respect to this example exponent set is described below.

Stating from the left, $e_0 = -13$ is coded as the absolute

Having reshaped the spectral exponent to the left of $e_2$, the algorithm moves to the right. Exponents $e_3 = -13$ and $e_4 = -12$ satisfy the differential constraint and do not need re-coding. At this step the exponent set is as below:

| $e'_0$ | $e'_1$ | $e'_2$ | $e'_3$ | $e'_4$ | $e_5$ | $e_6$ | $e_7$ | $e_8$ | $e_9$ | $e_{10}$ | $e_{11}$ | $e_{12}$ | $e_{13}$ | $e_{14}$ | $e_{15}$ | $e_{16}$ |
|---|---|---|---|---|---|---|---|---|---|---|---|---|---|---|---|---|
| −13 | −14 | −12 | −13 | −12 | −9 | 0 | −10 | −18 | −20 | −19 | −5 | −19 | −21 | −22 | −20 | −22 |

But $e_3=-9$ again poses a problem since under the differential constraint it can at best be coded as $-10$, which according to the theorem results in information loss. Again using the method of spectral exponent reshaping, the current exponent pointer is shifted to the local maxima lying immediately to the night, which in this case is at $e_6=0$. Therefore, starting from $e_6$, which is coded as 0 (no change) the spectral reshaping of $e_5$, $e_4$, $e_3$, . . . is performed. After spectral reshaping on the left of $e_6$, the differential coding proceeds as normal to the right until $e_{11}$ where differential coding information loss is again indicated. At this point the exponent set appears as:

| $e'_0$ | $e'_1$ | $e'_2$ | $e'_3$ | $e'_4$ | $e'_5$ | $e'_6$ | $e'_7$ | $e'_8$ | $e'_9$ | $e'_{10}$ | $e_{11}$ | $e_{12}$ | $e_{13}$ | $e_{14}$ | $e_{15}$ | $e_{16}$ |
|---|---|---|---|---|---|---|---|---|---|---|---|---|---|---|---|---|
| -12 | -10 | -8 | -6 | -4 | -2 | 0 | -2 | -4 | -6 | -8 | -5 | -19 | -21 | -22 | -20 | -22 |

Again $e_{11}$ happens to be the local maximum, since $e_{10}<e_{11}>e_{12}$. Therefore starting from $e_{11}$, which is coded as $-5$ (no change) the spectral reshaping of $_{10}e'_9e'$ is performed. Exponent $e'_{10}$ is coded as $-7$. Exponent $e'_9=-6$ already satisfies the constraint. Moreover, since $e'_9$ did not need any re-coding, all elements to the left of $e'_9$ are guaranteed by the algorithm to be already satisfying the differential constraint. The leftward spectral reshaping therefore halts and normal differential coding proceeds. The finally coded exponents (in absolute terms) are:

| $e'_0$ | $e'_1$ | $e'_2$ | $e'_3$ | $e'_4$ | $e'_5$ | $e'_6$ | $e'_7$ | $e'_8$ | $e'_9$ | $e'_{10}$ | $e'_{11}$ | $e'_{12}$ | $e'_{13}$ | $e'_{14}$ | $e'_{15}$ | $e'_{16}$ |
|---|---|---|---|---|---|---|---|---|---|---|---|---|---|---|---|---|
| -12 | -10 | -8 | -6 | -4 | -2 | 0 | -2 | -4 | -6 | -7 | -5 | -7 | -9 | -11 | -13 | -15 |

Figure 4:
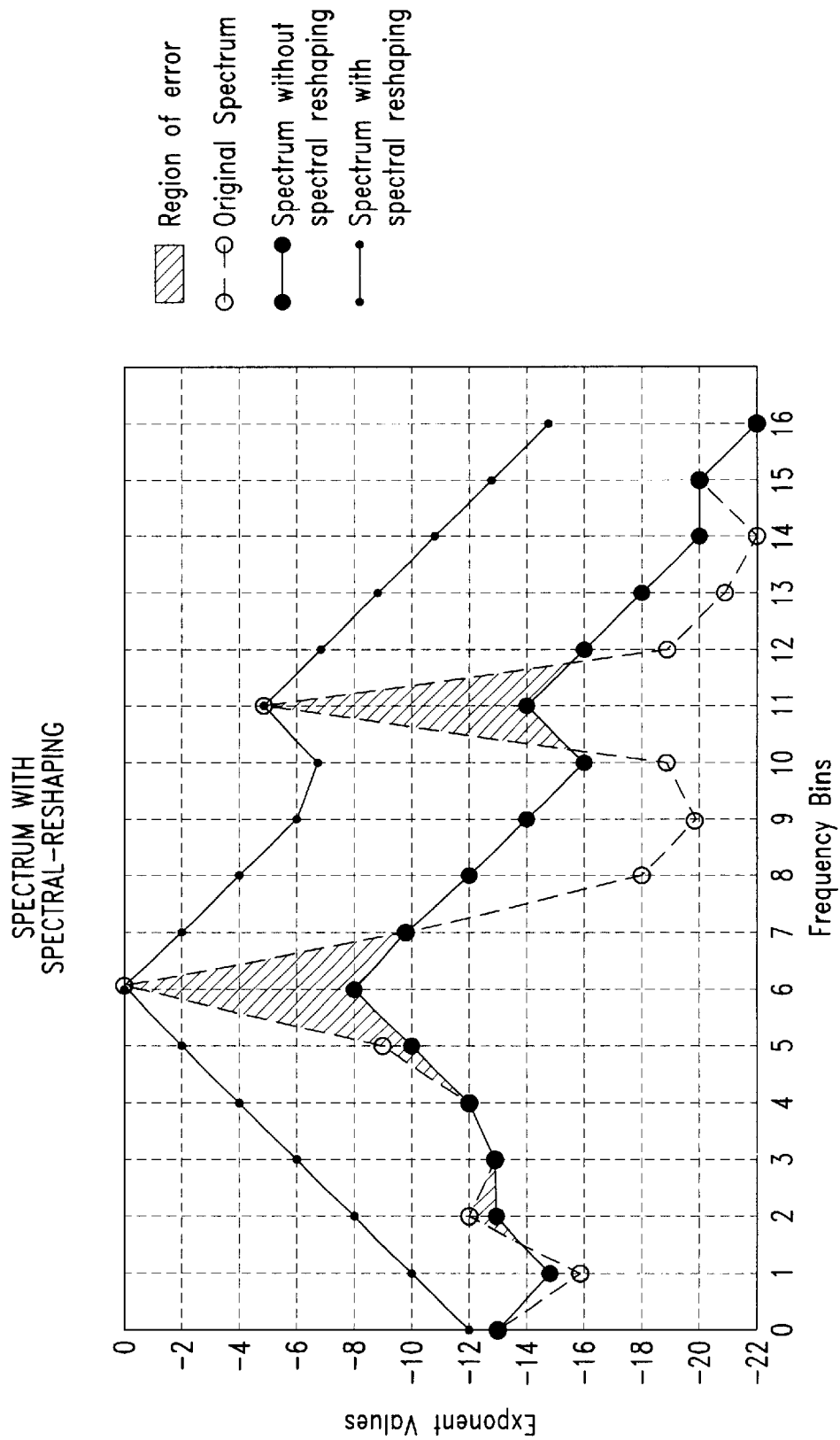
FIG. 4 is a graph of exponent values over a frequency range illustrating a spectrum employing spectral reshaping.

FIG. 4 is a graph illustrating a comparison between the original spectrum, the coded spectrum limited by the differential constraint, and the exponent set after spectral reshaping.

It has been shown hereinabove that the Spectral Exponent Reshaping Algorithm is complete (an algorithm is complete if it terminates successfully), and in fact the algorithm provides the optimal solution to the problem of readjusting exponents so that zeros padded into mantissas are minimal.

The above described theorem assumes that infinite precision is available for the mantissa (that is, shifting mantissas right does not result in any roll-over). However, even in the case of finite length arithmetic (assumed to be at least of reasonable length), inaccuracies arising from loss of lower bits of a mantissa is much less than erroneous coding of the corresponding exponent. Suppose only k bits are available for the mantissa, such that $m_i=0.m_{i0}\, m_{i1}\, m_{i2}\, \ldots\, m_{i(k-1)}$. Coding an exponent as $-6$ instead of its original value of $-5$ is equivalent to setting $m_{i0}=0$, whereas shifting the mantissa results in setting $m_{i(k-1)}=0$. Now, $m_{i0}$ is equivalent to $2^{-1}$ while $m_{i(k-1)}$ represents a value of $2^{-k}$. Therefore it is clear that wrongly coding exponent leads to much greater error.

Accordingly, in the case of "infinite" precision (that is, when a substantially large number of bits are available for mantissas), the algorithm is optimal as well. Therefore the proposed algorithm is complete and optimal.

Figure 5A:
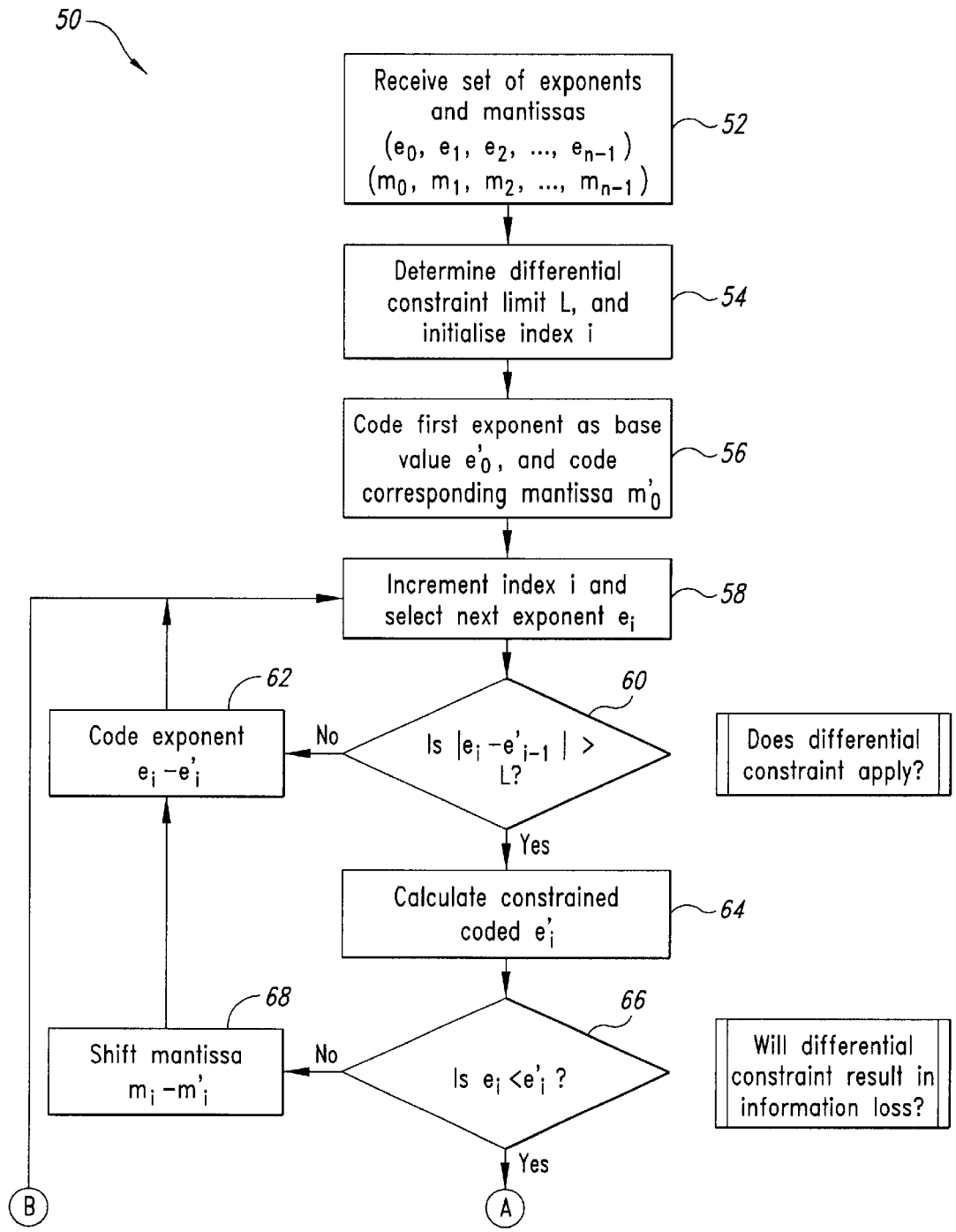
FIG. 5 is a flowchart diagram of a procedure for coding frequency coefficients according to an embodiment of the invention.
Figure 5B:
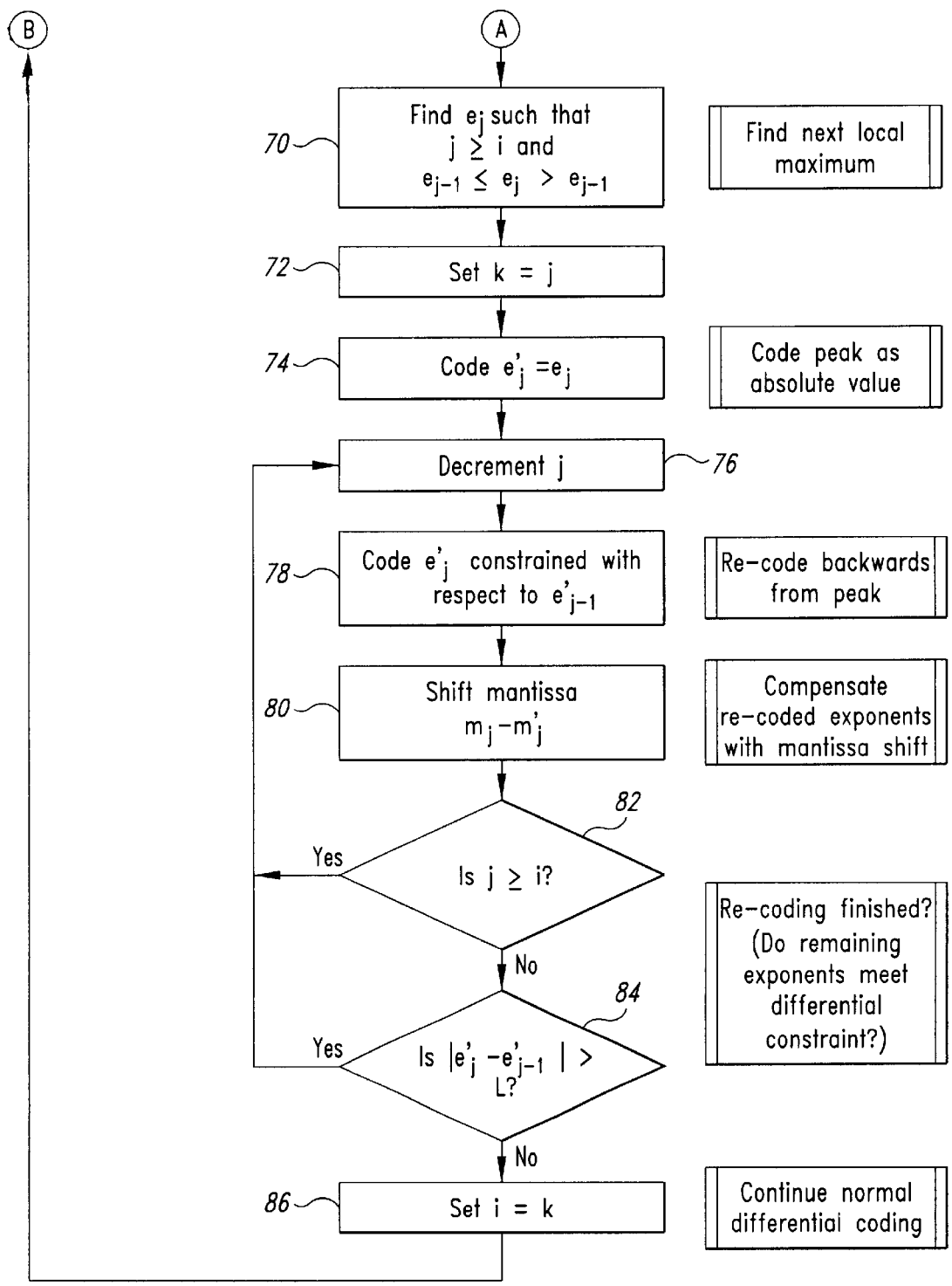

A flow-chart diagram illustrating a procedure 50 for efficient differential coding of frequency domain coefficients in exponent and mantissa form without significant information loss is shown in FIG. 5. At the beginning of the procedure 50 (step 52), a set of coefficients is received, comprising an ordered set of exponents ($e_0, e_1, e_2, \ldots, e_{u-1}$) and mantissas ($m_0, m_1, m_2, \ldots, m_{n-1}$). The procedure then initialises an index i, and determines the differential constraint limit L (step 54). As mentioned, the differential constraint limit is the limit by which adjacent coded exponents for the ordered exponent set may differ from one another following the differential coding. If an original exponent differs from the adjacent coded exponent by more than L, then the "differential constraint" is said to apply, and the exponent is coded to the closest value approximating the original exponent whilst still being within the differential constraint limit. However, as explained hereinabove, on some occasions when the differential constraint limit is applied, shifting of the mantissa bits can be employed to avoid a loss of information. On other accessions this technique is not applicable. Thus it is desirable to arrange the differential coding of the exponents so that in each case where the differential constraint is applied, compensation for information loss can be obtained through manipulation of the corresponding mantissa In the described embodiments of the invention such as the procedure 50 illustrated in FIG. 5, this involves re-coding of some exponents when a potential loss of information through constrained differential coding is detected.

To begin with the first exponent in the set ($e_0$) is coded as a base value (step 56), together with the corresponding mantissa $m_0$. The index i is then incremented and the next exponent $e_i$ is selected from input data set (step 58). The absolute difference between the selected exponent value ($e_i$) and the preceding exponent value$_{i-1}$(e) is then compared with the differential constraint limit (L) to determine whether the differential constraint applies (step 60). If the absolute difference does not exceed the limit L then the exponent $e_i$ can be differentially coded according to its original value (at least for the time being) without application of the differential constraint, and in that case the procedure passes to step 62 to generate the coded exponent ($e'_i$) before returning to step 58.

If the differential constraint is determined to apply at step 60, then the procedure continues to step 64 where the constrained coded version of the exponent is calculated ($e'_i$). The constrained coded exponent is then compared with the original exponent to determine whether the application of the differential constraint will result in a loss of information. If the coded exponent is less than the original exponent value then information loss can be avoided by shifting the corresponding mantissa bits, and in that case the procedure passes to step 68 for manipulation of the mantissa $m_i$. This manipulation is performed by shifting of the mantissa bits to the right (towards the least-significant-bit) by a number of positions corresponding to the integer difference between the coded and original exponent values. The procedure then carries on to step 62 where the exponent is coded according to the differential limit, before returning to step 58.

If it is determined at step 66 that the constrained coding of the exponent $e_i$ will result in a loss of information, then the procedure 50 continues on to step 70. At step 70 the exponent data set is examined to find the next "local maximums" amongst the exponents in the set. This can be accomplished by finding an exponent $e_j$ such that j>i and $e_{j-1} \geq e_j \geq e_{j+1}$. Once the local maximum has been located at step 70, the sequence position is recorded by setting index k=j which corresponds to the local maximum (step 72). The exponent at the local maximum ($e_j$) is then coded as a base value (i.e. not differentially coded with respect to any other exponent) at step 74.

The procedure then carries out the re-coding (or "spectral reshaping") of exponents to the "left" of the local maximum (i.e. for exponents with index values less than that of the local maximum (j)). This is performed by a looped routine involving steps 76 to 84 of the procedure 50. At step 76 the index counter j is decremented to select the next exponent "down" from the local maximum. The selected exponent $e_j$ is then coded (step 78) as $e_j$, constrained by the differential limit with respect to $e'_{j+1}$. Because the procedure at this stage is working down from a local maximum, the coding of any exponent which must be limited by the differential constraint will not be subject to information loss in this instance and can be compensated for by shifting of the corresponding mantissa. Accordingly, the mantissa is manipulated at step 80 to generate the coded mantissa $m'_j$.

Steps 82 and 84 are provided to determine when the spectral reshaping can be terminated and the procedure return to normal differential coding. At step 82, the procedure first determines whether the sequence position (j) of the re-coding process has yet reached the original index position (i). If not, the re-coding process loops back to step 76 to select the next exponent for re-coding. If the re-coding process has reached the starting index (i) then the absolute difference between the re-coded exponent and the next lowest index exponent as originally coded is compared with the differential constraint limit L (step 84). If the difference exceeds the limit, the re-coding process continues by looping back to step 76. If the process reaches an exponent at step 84 in which the adjacent previously coded exponent does not exceed the differential limit with respect to the most recently re-coded exponent, the spectral reshaping can stop and the procedure return to normal differential coding. This is accomplished by setting the current coding index i to the local maximum stored by index k (step 86) and returning to step 58.

The audio data coder apparatus 10 for carrying out the above described method is illustrated in FIG. 1. A frequency transform processor in the form of an analysis filter bank 12 is coupled to receive the input audio data stream $s_0, s_1, \ldots, s_{n-1}$. The filter bank generates frequency coefficients $c_0, c_1, \ldots, c_{n-1}$, which are passed to a differential coding processor 14. The differential coding processor 14 comprises an exponent extraction processor 16 which arranges the coefficients in a fixed point representation comprising exponents and mantissas, and passes the exponents and mantissas to a spectral exponent reshaping processor 18. The processor 18 codes the exponents and mantissas as above described, and outputs the coded coefficients for inclusion in the output (e.g. AC-3 format) data stream.

In summary, an inductive approach for spectral exponent reshaping is provided here. Let $(e_0, e_1, e_2, \ldots, e_{n-1})$ be the original ordered set of exponents. Starting from $e_0$ and moving towards right, exponents $e_1, e_2 \ldots$ are coded differentially, that is consecutive exponents always made to differ by less than L. The base case for the induction is e0 without loss of information.

Suppose $e_{i-1}$ has been recorded successfully as $e'_{i-1}$ without loss of information. Due to the differential-constraint, suppose $e_i$ can be represented closest as $e'_i$ (closest in the sense that $\|e_i - e'_i\|$ is minimum). If $e'_i \geq e_i$ then according to the theorem, there is no information loss. Having coded $e_i$ as $e'_i$, the algorithm moves forward to code $e_{i+1}$. However, if $e'_i < e_i$ then information loss will occur and one more step of processing must be performed.

The algorithm starting from $e_i$, where information loss due to coding was first observed, is moved right until the condition $e_i \leq e_{i+1} \leq e_{i+2} \leq e_{i+3}, \ldots e_{i+1}$ is satisfied. Therefore $e_{i+1}$ is the local maxima. Exponent $e_{i+1}$ is coded as $e_{i+1}$ itself. Then starting from $e_{i+1}$ the algorithm moves left differentially re-coding the exponents $e_{i+1-1}, e_{i+1-2}, e_{i+1-3}, \ldots$ It stops whenever $e_a(a<1)$ did not need to be recoded to a new value. If $e_a(a<i)$ did not need to be re-coded to enforce the differential-constraint then $e_{a-1}, e_{a-2}, \ldots$ will automatically satisfy the differential-constraint.

Having performed the spectral reshaping on the left of $e_{i+1}$, the algorithm continues the conventional exponent coding on the right of $e_{i+1}$ till it reaches another point where information loss due to differential-constraint occurs again.

When the exponent $e_{n-1}$ has been differentially coded successfully, the algorithm stops. $(e'_0, e'_1, e'_2, \ldots, e'_{n-1})$ is the new set of exponents satisfying the conditions for the differential constraint as well as avoiding any substantial loss of information.

The foregoing detailed description of the present invention has been presented by way of example only, and is not intended to be considered limiting to the invention as defined in the appended claims.

What is claimed is:

1. A method for coding a sequence of data elements each comprising an exponent and corresponding mantissa, including the steps of:
   a) coding a first data element in the sequence as a base value;
   b) coding a successive data element in the sequence with a coded exponent constrained by a differential limit with respect to the preceding data element exponent;
   c) determining a difference between the coded exponent of the successive data element and the original thereof as a result of said differential limit;
   d) if the difference determined at step c) is of a first sign, shifting the coded mantissa of the successive data element according to the magnitude of the difference;
   e) if the difference determined at step c) is of a second sign:
      i) examining data elements in the sequence to identify a data element exponent at a successive local peak in exponent values;
      ii) coding data elements in the reverse sequence order from said local peak data element, with coded exponents constrained by said differential limit and corresponding mantissas shifted according to a difference between the respective coded and original exponent values; and
   f) repeating steps b) to e) for the data elements in the sequence.

2. A method as claimed in claim 1, wherein the sequence of data elements comprise data representing digital audio data frequency coefficients.

3. A method as claimed in claim 1 wherein the reverse coding of step e)ii) is carried out until the differences in value between adjacent coded exponents of each of the data elements from the local peak to the first data element are within said differential limit.

4. A method as claimed in claim 1, 2 or 3, wherein, following the execution of step e), the successive data element coded at step b) is the data element sequentially following said local peak data element.

5. A method for coding a sequence of frequency coefficients comprising respective exponents and mantissas in a digital audio coder, comprising:
   a) selecting a base frequency coefficient in said sequence;
   b) differentially coding said frequency coefficients with a preselected differential constraint limit from said base coefficient in a forward sequence direction until a first predetermined condition with respect to exponent values of adjacent frequency coefficients in said sequence is detected;
   c) identifying a local peak in exponent values of coefficients in said forward sequence direction, and selecting the peak coefficient as a new base frequency coefficient;
   d) differentially coding said frequency coefficients with said differential constraint limit from said base coefficient in a reverse sequence direction until a second predetermined condition with respect to exponent values of adjacent frequency coefficients in said sequence is detected; and
   e) repeating from step b) until the entire sequence of frequency coefficients has been coded.

6. A method as claimed in claim 5, wherein said first predetermined condition corresponds to an information loss as a result of said differential constraint limit.

7. A method as claimed in claim 5, wherein differentially coding said frequency coefficients includes shifting the coded mantissa of a coefficient to prevent information loss in the coded coefficient as a result of application of the differential constraint limit to the corresponding coded coefficient exponent.

8. A digital audio coder for generating coded frequency coefficients from digital audio data, comprising:
   a frequency domain transform processor coupled to receive input audio data and generate a sequence of frequency coefficients therefrom, each frequency coefficient comprising an exponent and a mantissa;
   a differential coding processor coupled to receive said sequence of frequency coefficients from the frequency domain transform processor, and adapted to select a base frequency coefficient from said sequence and iteratively:
      differentially code said frequency coefficients with a preselected differential constraint limit from said base coefficient in a forward sequence direction until a first predetermined condition with respect to exponent values of adjacent frequency coefficients in said sequence is detected;
      identify a local peak in exponent values of coefficients in said forward sequence direction, and select the peak coefficient as a new base frequency coefficient; and
      differentially code said frequency coefficients with said differential constraint limit from said base coefficient in a reverse sequence direction until a second predetermined condition with respect to exponent values of adjacent frequency coefficients in said sequence is detected;
   until the entire sequence of frequency coefficients has been coded.

9. Apparatus as claimed in claim 8, wherein said first predetermined condition corresponds to an information loss as a result of said differential constraint limit.

10. Apparatus as claimed in claim 8, wherein said differential coding processor shifts the coded mantissa of a coefficient to prevent information loss in the coded coefficient as a result of application of the differential constraint limit to the corresponding coded coefficient exponent.

11. A method of coding a sequence of data elements each including an exponent and a corresponding mantissa, the method comprising:
   coding a first exponent in the sequence as a first base value in non-differential form;
   differentially coding successive exponents in the sequence in a forward sequence direction from the first exponent in a manner limited by a predetermined differential constraint limit until a first predetermined condition is detected;
   coding a subsequent exponent in the sequence as a second base value in non-differential form, in response to detecting the first predetermined condition;
   differentially coding exponents of the sequence in a reverse sequence direction from the subsequent exponent in a manner limited by the differential constraint limit until a second predetermined condition is detected; and
   differentially coding exponents in the sequence in a forward sequence direction from the subsequent exponent in a manner limited by the differential constraint limit until the first predetermined condition is detected again or until the sequence has been fully coded.

12. The method of claim 11 wherein the first predetermined condition corresponds to an information loss as a result of said differential constraint limit.

13. The method of claim 11, further comprising coding the mantissa of each data element in the sequence and adjusting one of the coded mantissas in response to application of the differential constraint limit on the exponent corresponding to the one of the coded mantissas.

14. The method of claim 11 wherein the second predetermined condition corresponds to reaching a coded exponent that satisfies the differential constraint limit.

15. The method of claim 11 wherein the subsequent exponent in the sequence that is coded as a second base value in non-differential form corresponds to a local peak in exponent values of the sequence.

* * * * *